(12) United States Patent
Ichiriu

(10) Patent No.: US 6,560,670 B1
(45) Date of Patent: May 6, 2003

(54) INTER-ROW CONFIGURABILITY OF CONTENT ADDRESSABLE MEMORY

(75) Inventor: Michael E. Ichiriu, Cupertino, CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 316 days.

(21) Appl. No.: 09/594,195

(22) Filed: Jun. 14, 2000

(51) Int. Cl.$^7$ .............................................. G06F 12/00
(52) U.S. Cl. ...................... 711/108; 711/214; 711/216; 365/230.03
(58) Field of Search ................................ 711/108, 103, 711/214, 216; 365/230.03

(56) References Cited

U.S. PATENT DOCUMENTS

| | | | |
|---|---|---|---|
| 3,257,646 A | 6/1966 | Roth | 340/172.5 |
| 3,353,159 A | 11/1967 | Lee, III | 340/172.5 |
| 4,159,538 A | 6/1979 | Motsch | |
| 4,575,818 A | 3/1986 | Almy et al. | 365/49 |
| 4,622,653 A | 11/1986 | McElroy | 365/49 |
| 5,053,991 A | 10/1991 | Burrows | 365/49 |
| 5,072,422 A | 12/1991 | Rachels | 365/49 |
| 5,325,501 A | 6/1994 | Carlstedt | |
| 5,394,353 A | 2/1995 | Nusinov et al. | 365/49 |
| 5,440,715 A | 8/1995 | Wyland | 395/435 |
| 5,444,649 A | 8/1995 | Nemirovsky | |
| 5,483,480 A | 1/1996 | Yoneda | 365/49 |
| 5,576,985 A | 11/1996 | Holtz | |
| 5,613,136 A * | 3/1997 | Casavant et al. | 712/28 |
| 5,706,224 A | 1/1998 | Srinivasan et al. | |
| 5,787,458 A | 7/1998 | Miwa | 711/108 |
| 5,818,786 A | 10/1998 | Yoneda | 365/230.03 |
| 5,930,790 A | 7/1999 | Law et al. | 707/6 |
| 5,943,252 A | 8/1999 | Schultz et al. | 365/49 |
| 5,999,435 A | 12/1999 | Henderson et al. | |
| 6,081,441 A | 6/2000 | Ikeda | 365/49 |
| 6,081,442 A | 6/2000 | Igarashi et al. | 365/49 |
| 6,098,147 A | 8/2000 | Mizuhara | |
| 6,137,707 A * | 10/2000 | Srinivasan et al. | 365/189.07 |

(List continued on next page.)

FOREIGN PATENT DOCUMENTS

| | | |
|---|---|---|
| EP | 0858077 A2 | 8/1998 |
| WO | WO99/23663 A1 | 5/1999 |

OTHER PUBLICATIONS

Ken Schultz and Andrew Sorowka, "High Performance CAMs for 10BG/s and Beyond", Gigabit Ethernet Conference (GEC2000), Mar. 27, 2000, pp. 147–154.

Primary Examiner—Reba I. Elmore
(74) Attorney, Agent, or Firm—Blakely Sokoloff Taylor & Zafman LLP (57) ABSTRACT

An inter-row configurable content addressable memory (CAM) system. For one embodiment, the CAM system includes an array of CAM cells having a plurality of rows of CAM cells for storing a data word chain, wherein the data word chain comprises a sequence of at least two data words each stored in a different row of CAM cells, and wherein each row of CAM cells includes a first group of CAM cells for storing a pointer and a second group of CAM cells for storing one of the data words. The pointer of the first data word of the data word chain may be a predetermined number greater than the number of rows in the CAM array. The pointers associated with the other data words of the data word chain each store an address of the previous data word in the data word chain. The CAM system further includes a write circuit for writing the data words into the rows of CAM cells, an address decoder coupled to the CAM array, and a priority encoder coupled to the CAM array.

47 Claims, 8 Drawing Sheets

U.S. PATENT DOCUMENTS

| | | |
|---|---|---|
| 6,147,890 A | 11/2000 | Kawana et al. |
| 6,166,938 A | 12/2000 | Wong |
| 6,175,514 B1 | 1/2001 | Henderson et al. |
| 6,199,140 B1 * | 3/2001 | Srinivasan et al. ........... 365/49 |
| 6,253,280 B1 | 6/2001 | Voelkel |
| 6,324,087 B1 * | 11/2001 | Pereira .................. 365/189.07 |
| 6,381,673 B1 * | 4/2002 | Srinivasan et al. ........... 365/49 |
| 6,438,674 B1 * | 8/2002 | Perloff ........................ 711/126 |
| 2001/0005876 A1 * | 6/2001 | Srinivasan et al. ......... 711/108 |
| 2002/0075714 A1 * | 6/2002 | Pereira et al. ................ 365/49 |

* cited by examiner

FIG. 1

| | | | |
|---|---|---|---|
| 116(0) → | 1024 | A | ⎫ |
| 116(1) → | 0 | B | ⎬ 202 |
| 116(2) → | 1 | C | ⎭ |
| 116(3) → | 1024 | D | ⎫ |
| 116(4) → | 3 | E | ⎬ |
| 116(5) → | 4 | F | ⎬ 204 |
| 116(6) → | 5 | G | ⎭ |

| | | |
|---|---|---|
| 116(0) → | 1024 | A |
| | ⋮ | |
| 116(25) → | 0 | B |
| 116(26) → | 1024 | D |
| | ⋮ | |
| 116(231) → | 25 | C |
| | ⋮ | |
| 116(502) → | 1023 | F |
| 116(503) → | 502 | G |
| | ⋮ | |
| 116(1023) → | 26 | E |

| | | | |
|---|---|---|---|
| 116(0) | 1024 | A | ⎫ |
| 116(1) | 0 | B | |
| 116(2) | 1 | C | ⎬ 502 |
| 116(3) | 2 | D | ⎭ |
| 116(4) | 1024 | A | ⎫ |
| 116(5) | 4 | B | |
| 116(6) | 5 | D | ⎬ 504 |
| 116(7) | 6 | E | ⎭ |

| | | |
|---|---|---|
| 116(0) | 1024 | A |
| 116(1) | 0 | B |
| 116(2) | 1 | C |
| 116(3) | 2 | D |
| 116(4) | 1 | D |
| 116(5) | 4 | E |

INTER-ROW CONFIGURABILITY OF CONTENT ADDRESSABLE MEMORY

FIELD OF THE INVENTION

The present invention relates generally to content addressable memories (CAMs), and more particularly to inter-row configurability of a CAM array.

BACKGROUND

A content addressable memory (CAM) system is a storage system that can be instructed to compare a specific pattern of comparand data with data stored in its associative CAM array. The entire CAM array, or segments thereof, is searched in parallel for a match with the comparand data. The CAM device typically includes a priority encoder to translate the highest priority matching location into a match address or CAM index.

The CAM array has rows of CAM cells that each stores a number of bits of a data word. U.S. Pat. No. 5,440,715 describes a technique for expanding the width of the data words beyond that of a single row of CAM cells. Multiple data words can be width expanded together to form a data line. It appears, however, that the CAM system of the '715 patent will not always output the correct match address. For example, assume a first data line of two data words ZY is stored in data words 0 and 1, respectively, and a second data line of two data words WZ is stored in data words 2 and 3, respectively. When a comparand data line of WZ is provided for comparison, the first cycle compare with W will indicate a match with data word 2 only. The second cycle compare with Z will indicate a match with data words 0 and 3 and match lines ML0 and ML3 will be activated. When the priority encoder is enabled, it will output a match address of 0 instead of 3 since ML0 is the highest priority match line.

Additionally, it appears that the CAM system of the '715 patent will not always function correctly when each data line has different numbers of data words. For example, assume that a data line of 5 words VWXYZ is loaded into data word locations 0–4, and a data line of 4 words VWXY is loaded into data word locations 5–8. When a comparand data line of VWXY is provided to the CAM array, ML3 and ML8 will both be activated and the priority encoder will incorrectly output an address of three that stores the last word of a five word data line and not the last word of a four word entry.

Additionally, it appears that the CAM system of the '715 patent is unable to store data words of a data line in non-consecutive rows and still be able to accurately search for the data line.

It would be desirable to have an improved technique of width expanding data words in a CAM array.

SUMMARY OF THE INVENTION

An inter-row configurable content addressable memory (CAM) system is disclosed. For one embodiment, the CAM system includes an array of CAM cells having a plurality of rows of CAM cells for storing a data word chain, wherein the data word chain comprises a sequence of at least two data words each stored in a different row of CAM cells, and wherein each row of CAM cells includes a first group of CAM cells for storing a pointer and a second group of CAM cells for storing one of the data words. The pointer of the first data word of the data word chain may be a predetermined number greater than the number of rows in the CAM array. The pointers associated with the other data words of the data word chain each store an address of the previous data word in the data word chain. The CAM system further includes a write circuit for writing the data words into the rows of CAM cells, an address decoder coupled to the CAM array, and a priority encoder coupled to the CAM array.

A method of using a CAM array to store and maintain a data word chain spanning more than one row of the CAM array is also disclosed. For one embodiment, the data word chain is written into the CAM array by determining the address of a first row in the CAM array that does not store valid data; writing a first data word of the data word chain to the first row in the CAM array; and writing a second data word of the data word chain and the address of the first row to a second row in the CAM array. The method may further include writing a null pointer with the first data word to indicate to the first row to indicate the first data word in the data word chain. For another embodiment, the data word chain is written into the CAM array by determining that a first data word in the data word chain matches data stored in a first row of the CAM array; determining the address of the first row; appending the address of the first row to a second data word in the data word chain; determining that no row in the CAM array stores data that matches the second data word and the address of the first row; and writing the second data word and the address of the first row to a second row in the CAM array.

A method of searching for a matching data word chain in the CAM array is also disclosed. For one embodiment, the method includes determining the address of a first row in the CAM array that stores data matching a first data word in the data word chain, and determining that a second row in the CAM array stores data that matches a second data word in the data word chain and the address of the first row. The method may further include appending a null pointer to the first data word, and comparing the first data word and the null pointer with the data stored in the CAM array. The method may also include appending the address of the first row to the second data word, and comparing the second data word and the address of the first row with the data stored in the CAM array.

A method of invalidating or deleting one or more data words of a data word chain stored in a content addressable memory (CAM) array is also disclosed. The data word chain comprises a sequence of n data words each stored in a unique row of CAM cells of the CAM array, where n is an integer greater than one, and wherein each data word has an associated pointer stored in the same row as the corresponding data word. For one embodiment, the method includes determining that the CAM array stores the data word chain, and invalidating the nth data word of the data word chain when the address of the row in the CAM array that stores the nth data word does not match any of the pointers of the data words. The method may further include invalidating the rest of the data words in the data word chain.

Another embodiment of invalidating one or more valid data words of a data word chain stored in a content addressable memory (CAM) array is also disclosed. The data word chain comprises a sequence of n data words each stored in a unique row of CAM cells of the CAM array, where n is an integer greater than one, and wherein each data word has an associated pointer stored in the same row as the corresponding data word. The method includes (a) determining that the CAM array stores the data word chain; (b) comparing the address of the row in the CAM array that stores the nth data word with the pointers of each of the data words; (c) setting x equal to the pointer of the nth data word; (d) setting y equal to the address of the row in the CAM array that stores the nth data word; (e) invalidating the data word at address y; (f) comparing x with the pointers of the remaining valid data words; (g) setting y equal to x; (h) setting x equal to the pointer at the address of x in the CAM array; and (i) repeating (e)–(h), inclusive, until x is equal to a null pointer associated with the first data word of the data word chain. The method may further include invalidating the first data word of the data word chain.

Other objects, features, and advantages of the present invention will be apparent from the accompanying drawings and from the detailed description that follows below.

BRIEF DESCRIPTION OF THE DRAWINGS

The features and advantages of the present invention are illustrated by way of example and are by no means intended to limit the scope of the present invention to the particular embodiments shown, and in which.

DETAILED DESCRIPTION

In the following description, for purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention unnecessarily. Additionally, the interconnection between circuit elements or blocks may be shown as buses or as single signal lines. Each of the buses may alternatively be a single signal line, and each of the single signal lines may alternatively be buses. Additionally, the prefix symbol "/" or the suffix "B" attached to signal names indicates that the signal is an active low signal. Each of the active low signals may be changed to active high signals as generally known in the art.

A CAM system is disclosed that includes a CAM array for storing a data word chain having a sequence of one or more data words in one or more rows of CAM cells. For one embodiment, each row of the CAM array includes a first group of CAM cells for storing a pointer and a second group of CAM cells for storing a data word in the data word chain. The first data word of each data word chain is assigned a null pointer that is a predetermined number. All other data words are assigned a pointer that is the address or index of the previous data word in the data word chain. In this way, the data words in a data word chain are linked together regardless of where in the CAM array each of the data words is stored. This enables a single CAM array to store data word chains spanning multiple rows, and may be useful for applications such as web caching, server load balancing, and web traffic monitoring that require wide word searches. For example, searches on URLs may require search widths on the order of thousands of bits.

Figure 1:
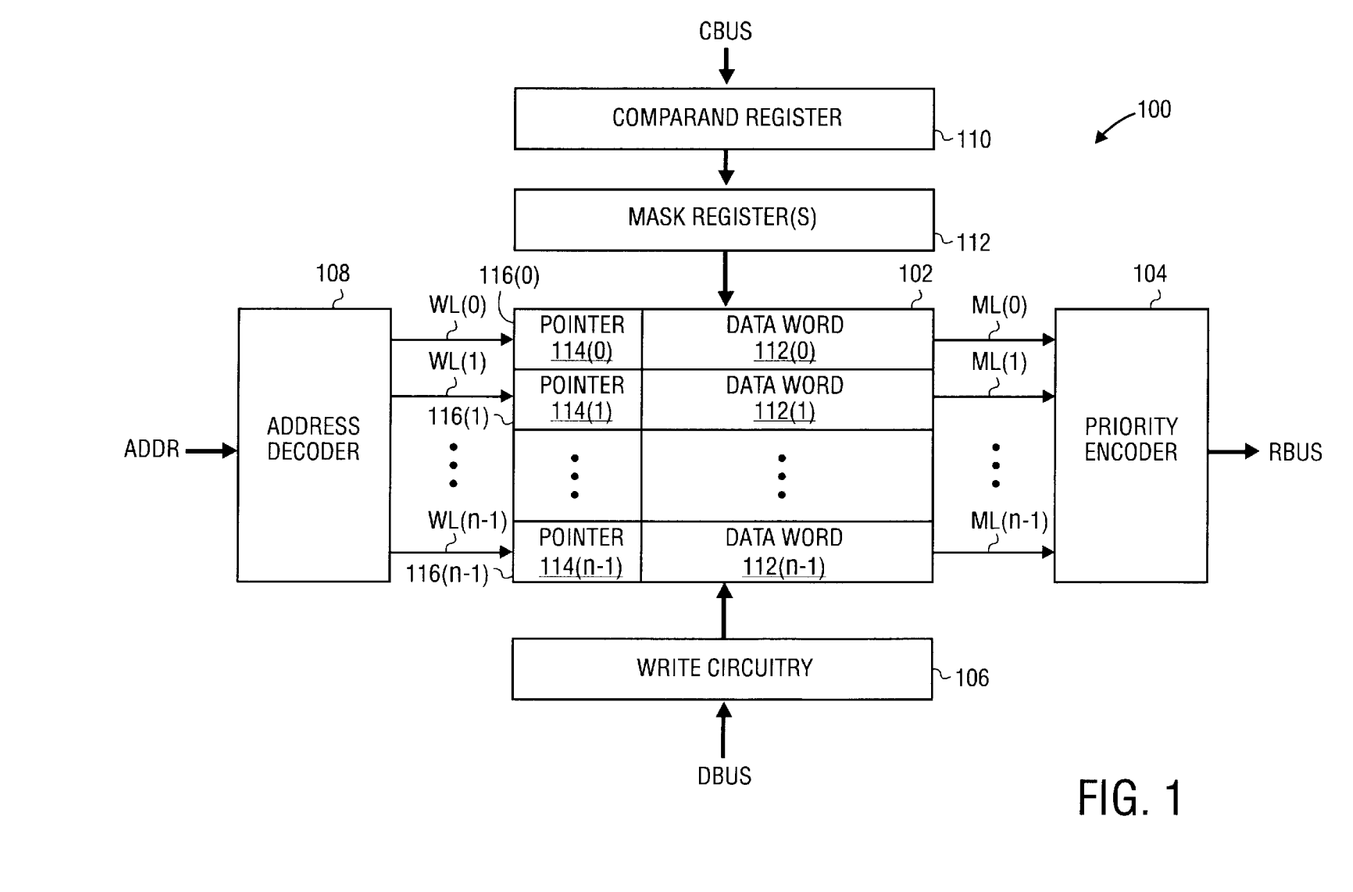
FIG. 1 is a block diagram of one embodiment of a CAM device including a CAM array having CAM rows each having a pointer field and a data word field.

FIG. 1 is a block diagram of one embodiment of a CAM system 100 that includes a CAM array 102, priority encoder 104, write circuitry 106, address decoder 108, comparand register 110, and one or more mask registers 112. Other CAM systems may be used. CAM system 100 may also include other well-known circuits including an instruction decoder or control logic, read circuitry, and flag logic for generating a match flag, full flag, and multiple match flag. CAM array 102 has n rows of CAM cells 116(0)–116(n−1), where n is any integer, that may be any type of CAM cells including binary or ternary CAM cells. Each CAM row includes a pointer field 114 and a data word field 112. The data word fields each store a data word in a data word chain that includes a sequence of one or more data words. The pointer fields each store a pointer for the associated data word of the same row. The first data word of each data word chain is assigned a null pointer that is a predetermined number. For other embodiments, the last data word may be assigned the null pointer. The null pointer may be a number that is greater than n so that it is outside the addressable range of rows of the CAM array. For another embodiment, a separate bit or bits may be used to indicate the null pointer. All data words other than the first data word in a particular data word chain are assigned a pointer that is the address or index of the previous data word in the chain. In this way, the data words in a data word chain are linked together regardless of where in the CAM array each of the data words is stored.

The pointers and data words can be written to the rows 116 by write circuitry 106 and address decoder 108. In response to an address ADDR, address decoder 108 enables one of the word lines WL(0)–WL(n−1) to select a particular row 116, and write circuitry 106 writes the pointer and data word from the data bus DBUS to the selected row of CAM cells. The address decoder and the write circuitry may operate in response to control signals that may be provided, for example, by an instruction decoder or other control logic not shown for simplicity. The write circuitry may be any write circuit including data drivers. Additionally, read circuitry (e.g., sense amplifiers) may be included in CAM system 100 to read the pointer and data word from a selected row of CAM cells.

A search key or comparand data may be provided to the CAM array for simultaneous comparison with the pointers and/or the data words. The comparand data is provided on the CBUS and may be stored in comparand register 110. The results of a comparison operation are indicated on match lines ML(0)–ML(n−1) and provided to priority encoder 104. The priority encoder determines the index or address of the highest priority matching entry and outputs the index to the RBUS. Alternatively, priority encoder 104 may determine the index of the lowest priority matching entry, or use any other priority determination scheme.

Figure 2:
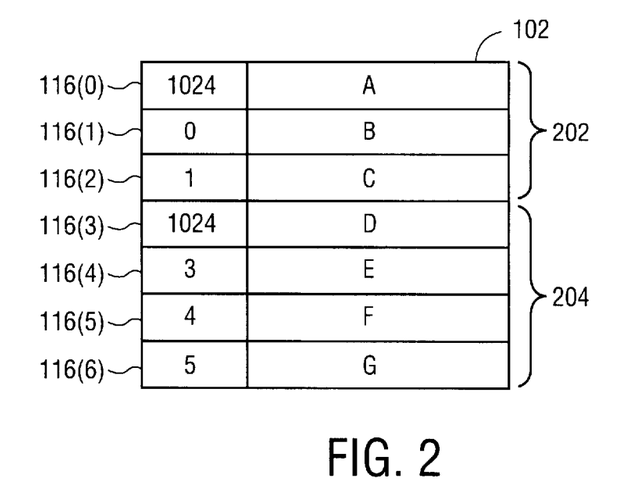
FIG. 2 is one embodiment of a CAM array storing two data word chains each having a different number of data words.

CAM array 102 may store data word chains that have the same number of data words or a different number of data words. For example, FIG. 2 shows CAM array 102 storing data word chain ABC 202 and data word chain DEFG 204. Data word chain ABC has data word A stored in row 116(0), data word B stored in row 116(1), and data word C stored in row 116(2). Data word chain DEFG has data word D stored in row 116(3), data word E stored in row 116(4), data word F stored in row 116(5), and data word G stored in row 116(6). Data words A and D are the first or root data words of their respective chains and therefore are assigned null pointers. For this example, CAM array 102 has 1024 rows of CAM cells (0 to 1023), and the null pointer is assigned to be 1024. For other embodiments, the null pointer may be any other number other than 0–1023. Data word B is the second data word in chain ABC. Thus, the pointer of data word B is set to 0, which is the address of the previous data word A in the chain. Similarly, data word C is the third data word in chain ABC and has a pointer equal to 1, which is the address of the previous data word B in the chain. In this manner, the data words of a particular data word chain are linked together.

Figure 3:
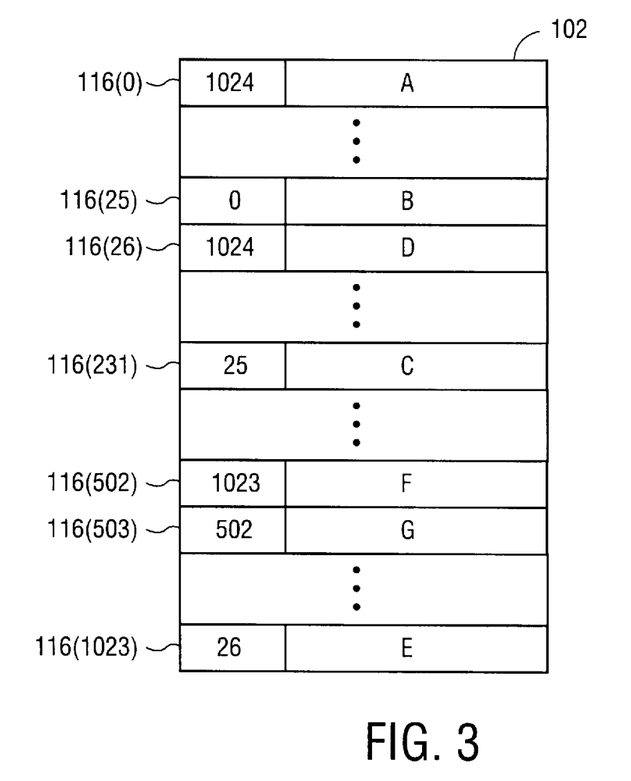
FIG. 3 is one embodiment of a CAM array storing two interleaved data word chains.

Because of the use of the pointers, the data words of a particular data word chain do not need be stored in adjacent or consecutive rows. As shown in FIG. 3, each data word of a data word chain may be stored in any available row of CAM cells. Also, as shown in FIG. 3, data words of different data word chains may be interleaved.

Searching for a Data Word Chain in the CAM Array

Figure 4:
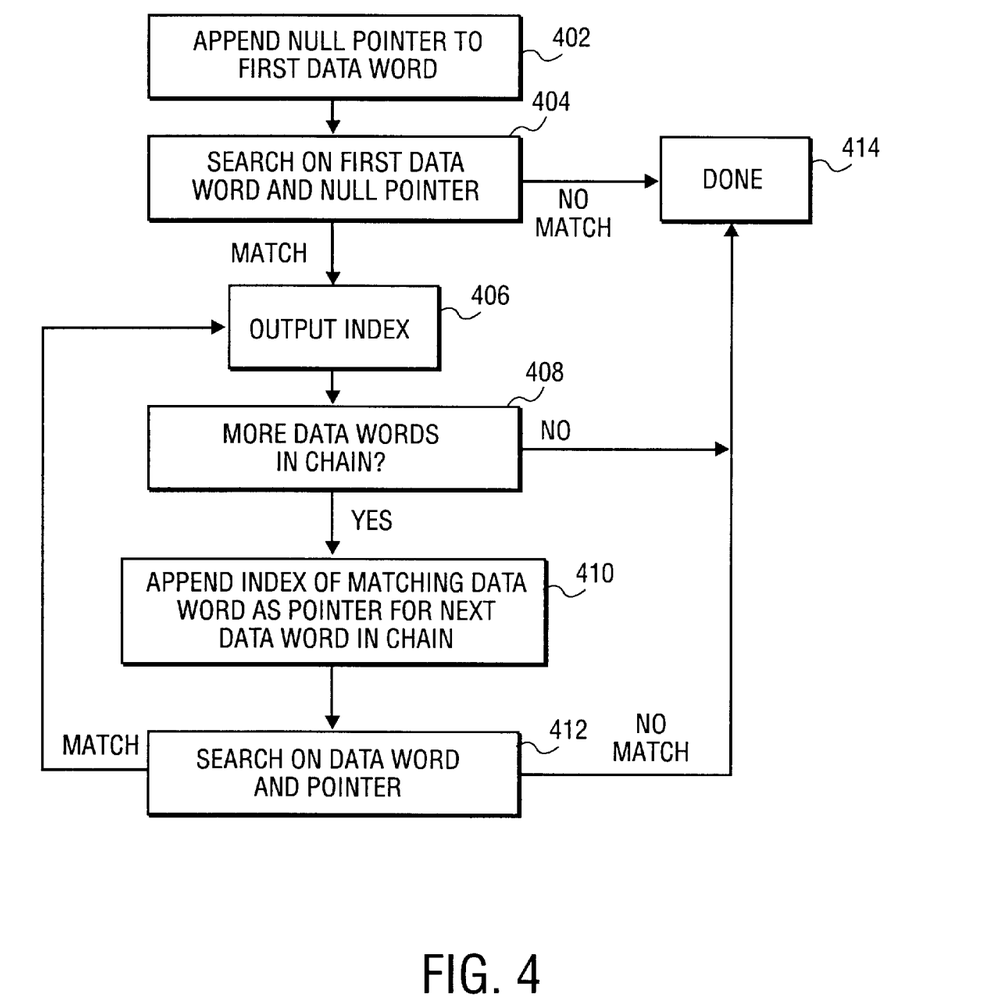
FIG. 4 is a flow chart of one embodiment of a method of searching for a data word chain in a CAM array.

An example of searching for a data word chain that matches comparand data is shown in FIG. 4. First, at step 402, the null pointer is appended to the first data word of the data word chain to be searched. The first data word and the null pointer are then provided as comparand data and compared with the entries in the CAM array. If there is no match, the process stops at step 414 and a no match condition may be signaled (e.g., by disabling a match flag). If there is a match, the index or address of the row in the CAM array at which the first data word is stored is output to the RBUS via priority encoder 104 (step 406). If there are no more data words in the data word chain (step 408), the process stops at step 414. If, however, there is another data word in the data word chain to be searched on, the index associated with the first data word is appended as the pointer for the next data word (step 410), and the next data word and its pointer are then provided as comparand data to the CAM array and searched against all of the entries therein (step 412). If there is a match, then the process returns to step 406 and continues until all of the data words of a data word chain are searched for in the CAM array. When there is no match at step 412, the process stops at step 414.

The search process of FIG. 4 may be further illustrated by searching for data word chain ABC in CAM array 102 of FIG. 2. First, the null pointer 1024 is appended to the first data word A (step 402). Data word A and the null pointer are then simultaneously searched against all entries in the CAM array (step 404). A match is determined at row 0 and the index 0 output to the RBUS (step 406). The index 0 is appended to the next data word B (steps 408 and 410), and the concatenation compared against the entries in the CAM array (step 412). A match is determined at row 1 and the index 1 output to the RBUS. The index 1 is appended to the next data word C, and the concatenation compared against the entries in the CAM array. A match is determined at row 2 and the index 2 output to the RBUS. Since there are no more data words to be searched, the process stops and indicates a match condition (e.g., by enabling a match flag). The index of the last data word C output to the RBUS may then be used, for example, to access data stored in another memory.

Figure 5:
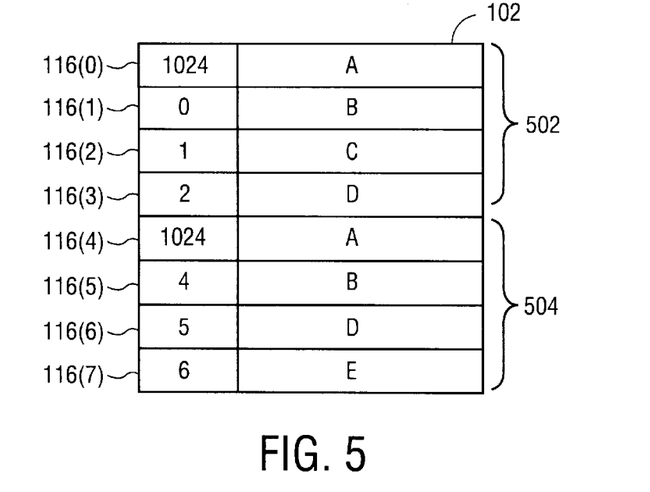
FIG. 5 is one embodiment of a CAM array storing two data word chains each having the same root or first data word.
Figure 6:
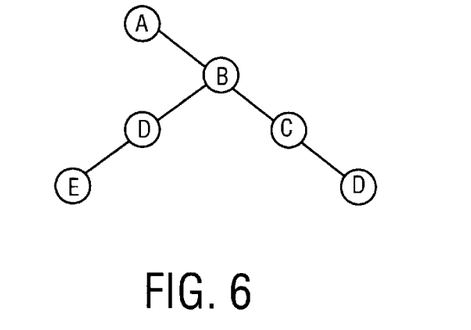
FIG. 6 is a search tree for the two data word chains of FIG. 7.

If two data word chains share a common first data word, the search process may produce an incorrect match result if the data word chains are not stored in the CAM array in a tree structure as will be discussed below. For example, assume that data word chain ABCD 502 and ABDE 504 are stored in CAM array 102 as shown in FIG. 5. Each data word chain has the same first data word A assigned a null pointer 1024. When the null pointer and data word A are provided for comparison at step 404 of FIG. 4, both row 0 and row 4 will indicate a match on their respective match lines. Priority encoder 104 will then output the index of the higher priority row regardless of whether the search is for chain 502 or chain 504. Assuming that the higher priority row is row 0, then a search for chain ABDE will initially yield an incorrect index when searching for data word A. Additionally, a mismatch condition will ultimately and erroneously be determined because the pointers associated with data words D and E would be incorrect. Thus, data word chains that share a common first data word are loaded into the CAM array as a tree structure as shown in FIGS. 6 and 7 rather than as shown in FIG. 5.

Figure 7:
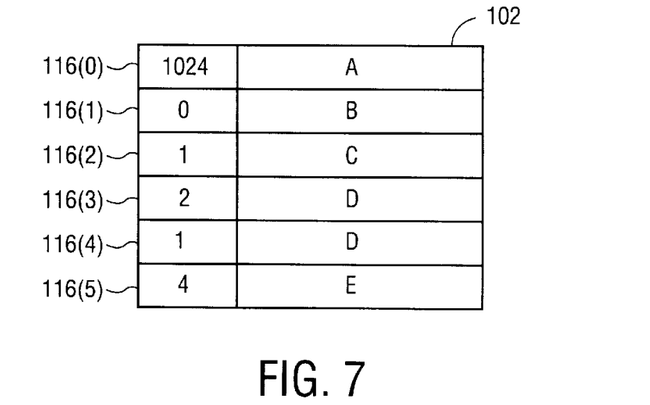
FIG. 7 is another embodiment of a CAM array storing the two data word chains of FIG. 5 and illustrated in the search tree of FIG. 6.

Since chains ABCD and ABDE have the first two data words A and B in common, data words A and B need only be stored once in the CAM array as shown in FIG. 7. Data words C and D of chain ABCD can then be stored anywhere in the CAM array with their respective pointers indicating the addresses of data words B and C, respectively. Additionally, data words D and E of chain ABDE can be stored anywhere in the CAM array with their respective pointers indicating the addresses of data words B and D, respectively. When data word chain ABCD is searched for in the array of FIG. 7, the first data word A will only yield a single match and the process of FIG. 4 will correctly determine a match.

Writing Data Word Chains to the CAM Array

Data word chains can be written into the CAM array using write circuitry 106 and address decoder 108 of FIG. 1. When a new data word chain does not have a common first data words can we written into the CAM array in a tree structure such as the tree chain can be written or loaded into any available rows of the CAM array. However, to avoid the issue highlighted with respect to FIG. 5, data word chains having common first data words can we written into the CAM array in a tree structure such as the tree structure illustrated in FIG. 6. Before writing a new data word chain to the CAM array, an iterative search of the existing tree structure, if any, already in the CAM array is initially performed to determine where to start adding data words such that duplicate entries are avoided.

Figure 8:
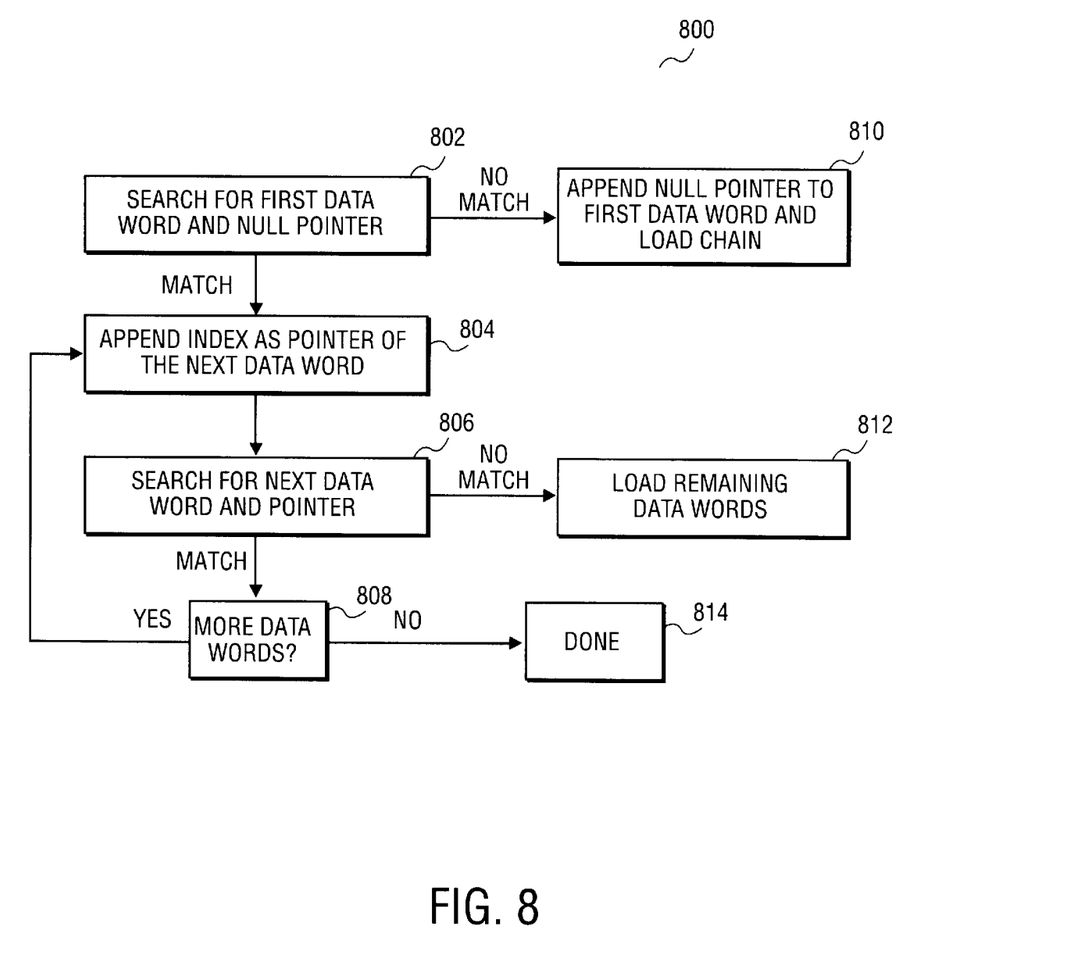
FIG. 8 is a flow chart of one embodiment of a method of determining the existing tree structure of a data word chain in a CAM array.

FIG. 8 is one embodiment of determining the existing tree structure of data word chains in a CAM array before writing one or more data words of a new data word chain to the array. Steps 802–808 determine the extent to which any stored data word chains have common initial data words with a new data word chain. First, at step 802, the first data word of the new entry and a null pointer are provided as comparand data and compared with all entries in the CAM array. If no match is found, then the null pointer is appended to the new first data word and the new data word chain and its corresponding pointers are loaded into available rows in the CAM array (step 810) using the process, for example, illustrated in FIG. 9. If, however, a match is found at step 802, then a data word chain already stored in the CAM array has a common first data word with the new data word. The new data word chain does not need to store its first data word and null pointer in the CAM array as this entry already exists. The index or address of the first data word stored in the CAM array is read from the RBUS and appended to the next data word in the new data word chain as its pointer (step 804). The next data word and its pointer are then provided as comparand data and compared with all entries in the CAM array (step 806). If there is no match, the branch in the tree structure has been determined and the balance of the data words in the new chain are written into available rows in the CAM array (step 812) as illustrated, for example, in FIG. 9. If there is a match at step 806, then the searched data word does not need to be written to the CAM array since it already exists in the CAM array with the correct relationship to the first data word. If there are no more data words in the new chain, the process stops at step 814; however, if there are more data words, the process continues until a mismatch condition occurs or there are no more data words in the new chain.

Figure 9:
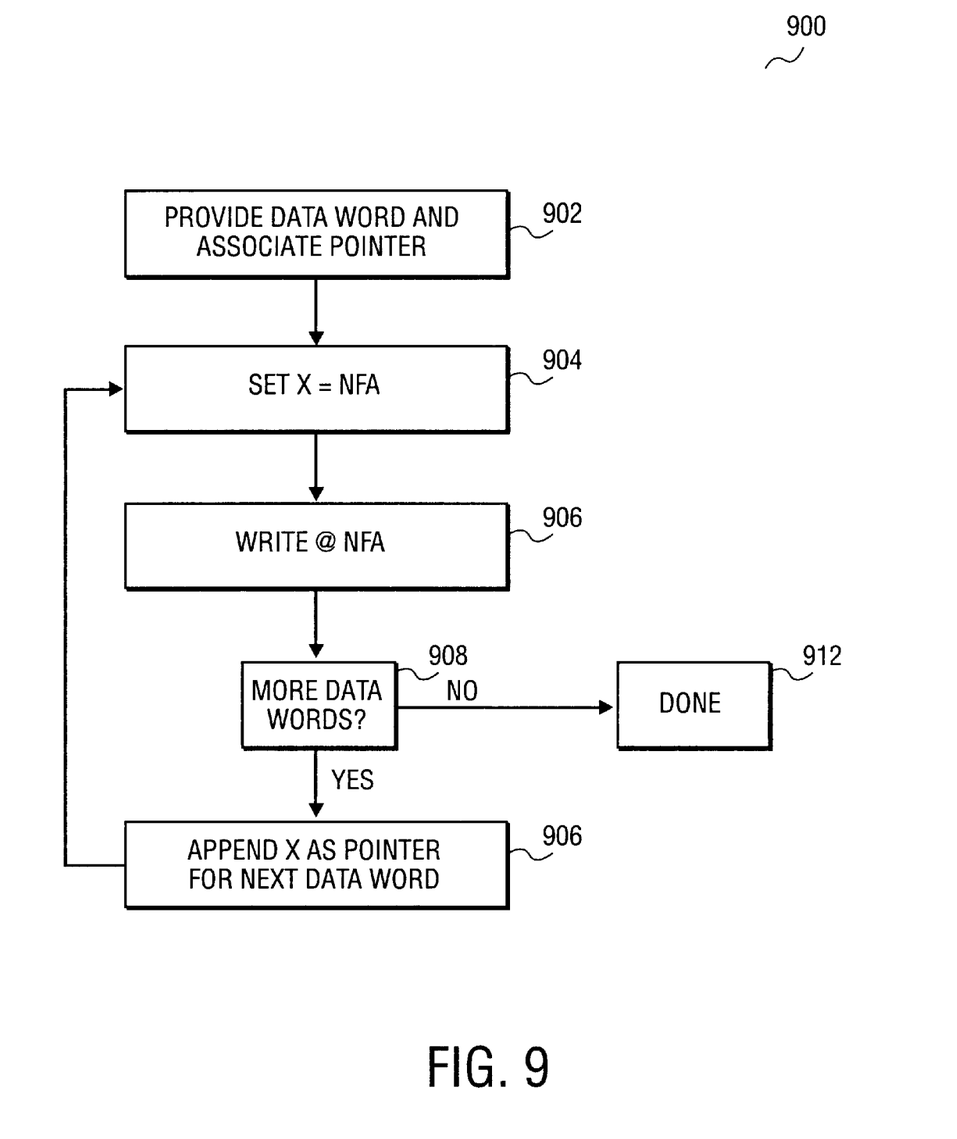
FIG. 9 is a flow chart of one embodiment of a method of writing a data word chain into a CAM array.

FIG. 9 is one embodiment of writing a data word chain into available entries in a CAM array. At step 902, a data word and its associated pointer of a new chain are provided for writing into the CAM array by write circuitry 106 and address decoder 108. The new data word may be the first data word (and its null pointer) as, for example, from step 810 of FIG. 8, or the new data word may be a subsequent data word (and its corresponding pointer) in the new data word chain as, for example, from step 812 of FIG. 8. At step 904, the next available row or next free address (NFA) in the CAM array is determined and stored in a variable X. The next free address may be determined by sending a read next free address command to an instruction decoder and reading the address from the RBUS as generally known in the art, or by reading the next free address from an NFA bus (not shown) as generally known in the art. The new data word and its associated pointer are then written into the next free address of the CAM array at step 906. If there are no more new data words to be written into the CAM array (step 908), the process stops at step 912. If however, there is another data word to be written in the new data word chain, X is appended as the pointer for the next data word (step 910) and the process returns to step 904. The process continues until all data words of the new chain have been written into the CAM array.

The process of FIGS. 8 and 9 can be further illustrated by writing the tree structure of FIG. 6 into the CAM array as shown in FIG. 7. For purposes of illustration, CAM array 102 is empty when data word chains ABCD and ABDE are provided for storage. First, chain ABCD is written into CAM array 102. At step 802, the null pointer 1024 is appended to data word A and compared with the entries in the CAM array. Since no entries are found, data word A and the null pointer are provided to write circuitry 106 at step 902 of FIG. 9. Since the array is empty, NFA and X are equal to 0 (step 904). Data word A and the null pointer are then written into row 0 (step 906), and index 0 is appended to data word B (step 910). X is then updated to the next free address of 1 (step 906). Data word B and its pointer 0 are then written into row 1 (step 906), and index 1 is appended to data word C (step 910). X is then updated to the next free address of 2 (step 906). Similarly, data word C and its pointer 1 are then written into row 2 (step 906), and index 2 is appended to data word D (step 910). X is then updated to the next free address of 3 (step 906). Finally, data word D and its pointer 2 are then written into row 3 (step 906) and the process stops (steps 908 and 912).

After chain ABCD is written into the array, chain ABDE is written into the array using the processes of FIGS. 8 and 9. At step 802, the null pointer 1024 is appended to data word A and the two are compared with the entries in the array. A match is determined with the entry that is already stored at address 0. Thus, data word A is not written again into the array. The index 0 is output to the RBUS by priority encoder 104 and appended to the next data word B (step 804). Data word B and its pointer 0 are compared with the entries in the array (step 806) and a match is determined with the entry that is already stored at row 1. Thus, data word B is not written again into the array. The index 1 is output to the RBUS and appended to the next data word D (step 804). Data word D and its pointer 1 are compared with the entries in the array (step 806) and no match is determined. Thus, the sequence AB was previously stored in the array, but the sequence ABD was not. The process then transitions to step 902 of FIG. 9. At step 902, data word D and its pointer 1 are provided to the write circuitry for writing into the array. At step 904, the next free address of 4 in the CAM array is stored in X. Data word D and its pointer 1 are then written into row 4 (step 906), and index 4 is appended to data word E (step 910). X is then updated to the next free address 5 in the CAM array (step 906). Data word E and its pointer 4 are then written into row 5 (step 906) and the process stops (steps 908 and 912).

Deleting a Data Word Chain in a CAM Array

A data word chain can be deleted or invalidated by first searching (as in FIG. 4) for the data word chain and recording the address or index of each data word in the chain. Subsequently, each entry can then be deleted or invalidated by setting one or more validity bits (as generally known in the art) for that row to the appropriate state to indicate that the row of CAM cells does not store valid data. If, however, data words stored in the array have common first data words as in FIGS. 6 and 7, the tree topology must be determined such that a common first data word is not deleted when only one of the data words that share the common first data word is effectively deleted from the array. That is, for the example of FIG. 7, if chain ABCD is to be deleted, then data words A and B must still remain valid in the array for chain ABDE, while the sequence of data words CD may be deleted.

Figure 10:
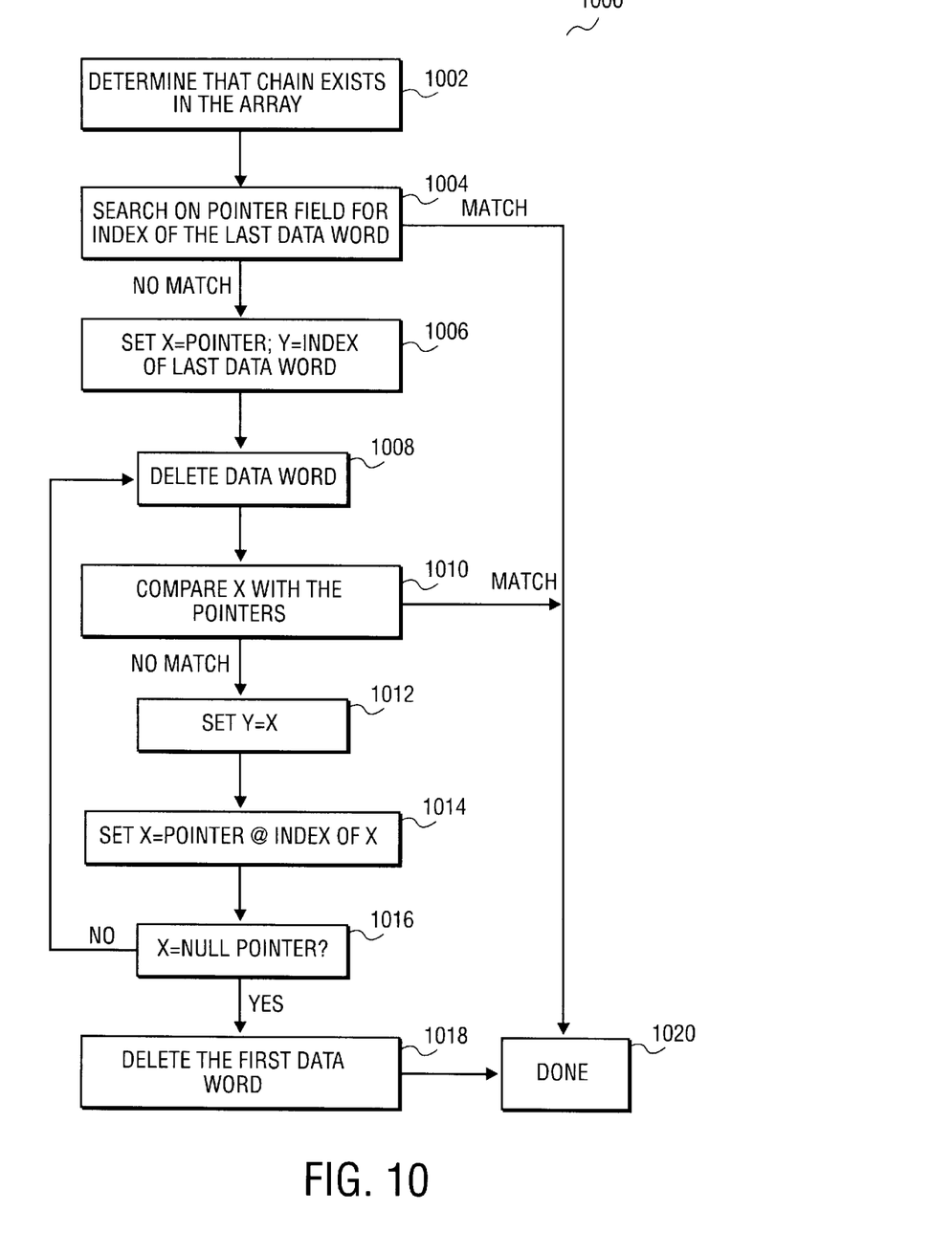
FIG. 10 is a flow chart for one embodiment of a method of deleting or invalidating a data word chain in a CAM array.

FIG. 10 is one embodiment of deleting or invalidating a data word chain from the array. The process will be described to delete chain ABCD from the array of FIG. 7. Initially, the process determines whether the data word chain exists in the array by performing a search operation (step 1002) and recording the pointer and index associated with each data word in the chain. This may be accomplished by using the process of FIG. 4 and recording the pointer and index associated with each data word A, B, C, and D of the chain. The index 3 of the last data word D is then compared with the pointers while the data words are masked by mask register(s) 112. If there is a match, then another, longer data word chain includes chain ABCD (e.g., if another data word chain of ABCDE was also stored in the array), and data word D will not be deleted and the process stops at step 1020. In this example, the index 3 does not match any of the pointers and variable X is set to data word D's pointer value of 2, and Y is set to the index value of 3 (step 1006). Data word D is then deleted (step 1008). X is then compared with the pointers while the data words are masked (step 1010). Since data word D and its pointer were already deleted or invalidated, there should be no match between the pointers and X. If, however, there is a match, then the process stops at step 1020 and an error condition may be signaled. Y is then updated with X (step 1012), and X is set to the pointer at an index of X (step 1014). That is, X is set to the pointer of the next data word C up in the chain. For this example, the pointer 1 at address 2 associated with data word C is loaded into X. Since X is not the null pointer (step 1016), data word C is deleted (step 1008). X is then compared with the pointers while the data words are masked (step 1010). Since data word C and its pointer were already deleted or invalidated, its data pointer will not generate a match. The pointer 1 associated with data word D of chain ABDE, however, will register a match indicating that a branch in the tree has been identified. As such, the process stops at step 1020 and does not delete data words A or B. Thus, data words C and D have been deleted, but data words A and B have remained valid in the array for chain ABDE. For an alternative embodiment in which chain ABDE did not exist in the array, then the process of FIG. 10 would continue through step 1016 until it is determined that X is the null pointer and the first data is then deleted at step 1018.

Figure 11:
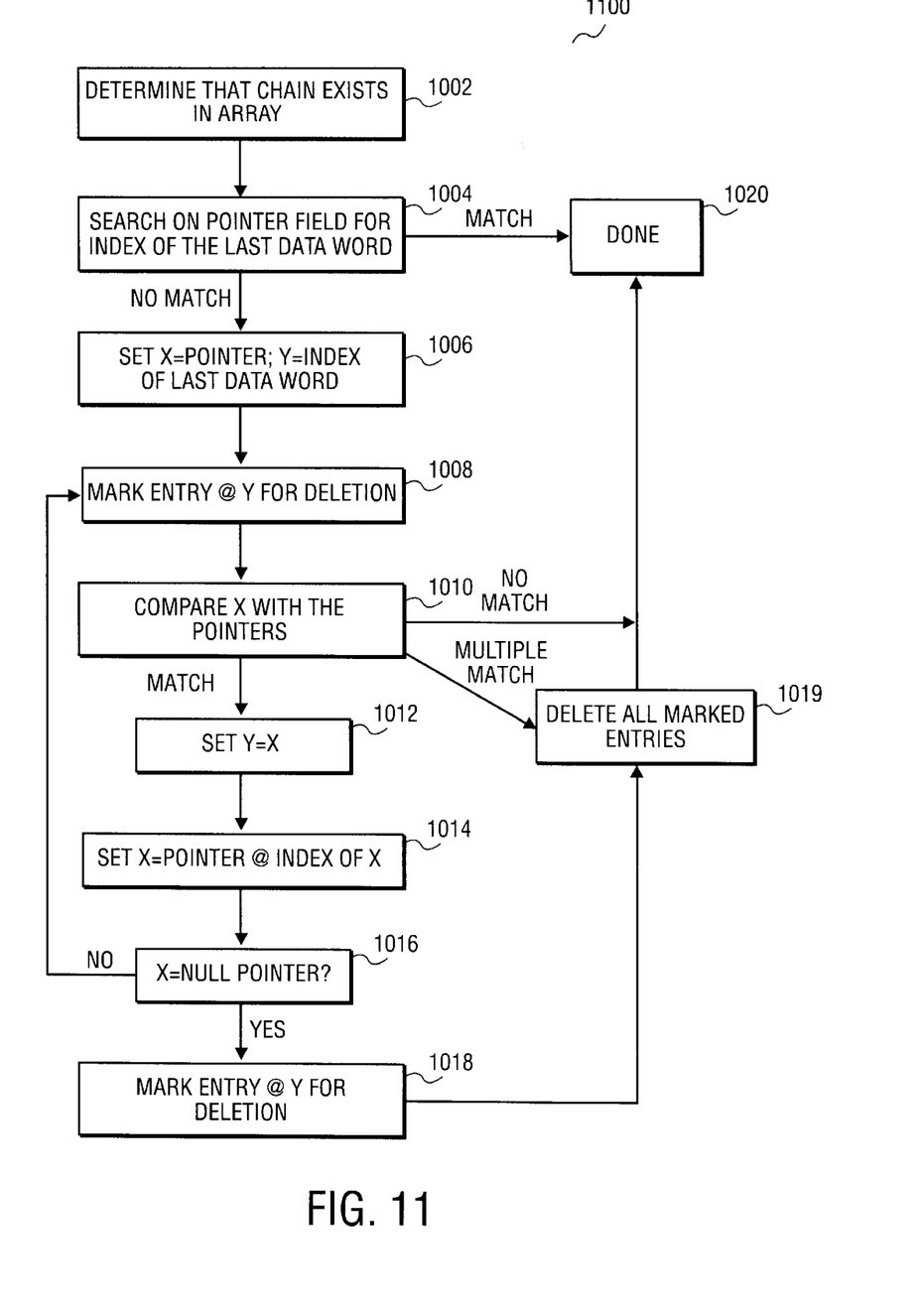
FIG. 11 is a flow chart for another embodiment of a method of deleting or invalidating a data word chain in a CAM array.

For an alternative embodiment, delete steps 1008 and 1018 may be replaced with steps that mark or record the addresses of the data words to be deleted as shown in FIG. 11. The marked entries will be deleted at step 1019 after step 1018 or if there is a multiple match condition determined at step 1010. Additionally, step 1010 will transition to step 1012 if there is a match condition, and will transition to step 1020 is there is a no match condition.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method of determining that a data word chain matches data stored in a a plurality of rows of content addressable memory (CAM) cells of a CAM array, wherein the data word chain comprises a sequence of at least two data words, the method comprising:
   determining the address of a first row in the CAM array that stores (i) data matching a first data word in the data word chain and (ii) a first pointer value; and
   determining that a second row in the CAM array stores (i) data that matches a second data word in the data word chain and (ii) a second pointer value that corresponds to the address of the first row, the second pointer value being different from the first pointer value.

2. The method of claim 1, wherein determining the address of the first row comprises comparing the first data word with data stored in the CAM array.

3. The method of claim 2, wherein determining the address of the first row comprises:
   appending a null pointer value to the first data word; and
   comparing the first data word and the null pointer value with the data and first pointer value stored in the first row of the CAM array.

4. The method of claim 3, wherein the null pointer value comprises a number that is outside the addressable range of rows of the CAM array.

5. The method of claim 1, wherein determining that the second row stores data that matches the second data word and the second pointer value comprises:
   appending the address of the first row to the second data word; and
   comparing the second data word and the address of the first row with the data and second pointer value stored in the second row of the CAM array.

6. The method of claim 1, wherein the address of the second row is greater than the address of the first row.

7. The method of claim 1, wherein the address of the second row is less than the address of the first row.

8. A method of determining that a data word chain matches data stored in a plurality of rows of content addressable memory (CAM) cells of a CAM array, wherein the data word chain comprises a sequence of at least two data words, the method comprising:
   comparing a first data word and a corresponding null pointer with the data stored in the CAM array;
   determining that the first data word and the null pointer match data stored in a first row of the CAM array;
   determining the address of the first row of the CAM array;
   appending the address of the first row to a second data word;
   comparing the second data word and the address of the first row with data stored in the CAM array; and
   determining that the second data word and the address of the first row match data stored in a second row of the CAM array.

9. The method of claim 8, wherein the null pointer comprises a number that is outside the addressable range of rows of the CAM array.

10. The method of claim 8, wherein the address of the second row is greater than the address of the first row.

11. The method of claim 8, wherein the address of the second row is less than the address of the first row.

12. A method of writing a data word chain into a plurality of rows of content addressable memory (CAM) cells of a CAM array, wherein the data word chain comprises a sequence of at least two data words, the method comprising:
   determining the address of a first row in the CAM array that does not store valid data;
   writing a first data word of the data word chain and a first pointer value to the first row in the CAM array; and
   writing a second data word of the data word chain and a second pointer value to a second row in the CAM array, the second pointer value corresponding to the address of the first row and being different from the first pointer value.

13. The method of claim 12, further comprising determining the address of the second row before writing the second data word and the second pointer value to the second row.

14. The method of claim 12, wherein writing the first data word and the first pointer value to the first row in the CAM array comprises:
   appending a null pointer to the first data word; and
   writing the null pointer and the first data word to the first row in the CAM array.

15. The method of claim 14, wherein the null pointer comprises a number that is outside the addressable range of rows of the CAM array.

16. The method of claim 12, wherein the address of the second row is greater than the address of the first row.

17. The method of claim 12, wherein the address of the second row is less than the address of the first row.

18. The method of claim 12, further comprising initially determining that the first data word in the data word chain does not match data stored in the CAM array.

19. A method of writing a data word chain into a plurality of rows of content addressable memory (CAM) cells of a CAM array, wherein the data word chain comprises a sequence of at least two data words, the method comprising:

determining the address of a first row in the CAM array that does not store valid data;

writing a null pointer and a first data word of the data word chain to the first row in the CAM array; and writing a second data word in the data word chain and the address of the first row to a second row in the CAM array.

20. The method of claim 19, wherein the null pointer comprises a number that is outside the addressable range of rows of the CAM array.

21. The method of claim 19, wherein the address of the second row is greater than the address of the first row.

22. The method of claim 19, wherein the address of the second row is less than the address of the first row.

23. The method of claim 19, further comprising initially determining that the first data word in the data word chain does not match data stored in the CAM array.

24. The method of claim 19, further comprising determining that the second row does not store valid data before writing the second data word and the address of the first row to the second row.

25. A method of writing a data word chain into a plurality of rows of content addressable memory (CAM) cells of a CAM array, wherein the data word chain comprises a sequence of at least two data words, the method comprising:

determining that a first data word in the data word chain matches data stored in a first row of the CAM array;

determining the address of the first row;

appending the address of the first row to a second data word in the data word chain;

determining that no row in the CAM array stores data that matches the second data word and the address of the first row; and writing the second data word and the address of the first row to a second row in the CAM array.

26. The method of claim 25, further comprising:

determining the address of the second row; and writing a third data word and the address of the second row to a third row in the CAM array.

27. The method of claim 25, wherein determining that the first data word matches data stored in the first row comprises:

appending a null pointer to the first data word; and determining that the null pointer and the first data word match data stored in the first row.

28. The method of claim 27, wherein the null pointer comprises a number that is outside the addressable range of rows of the CAM array.

29. The method of claim 25, wherein the address of the second row is greater than the address of the first row.

30. The method of claim 25, wherein the address of the second row is less than the address of the first row.

31. A method of invalidating one or more data words of a data word chain stored in a content addressable memory (CAM) array, wherein the data word chain comprises a sequence of n data words each stored in a unique row of CAM cells of the CAM array, where n is an integer greater than one, and wherein each data word has an associated pointer stored in the same row as the corresponding data word, the method comprising:

determining that the CAM array stores the data word chain; and invalidating the nth data word of the data word chain when the address of the row in the CAM array that stores the nth data word does not match any of the pointers of the data words.

32. The method of claim 31, further comprising invalidating the rest of the data words in the data word chain.

33. A method of invalidating one or more valid data words of a data word chain stored in a content addressable memory (CAM) array, wherein the data word chain comprises a sequence of n data words each stored in a unique row of CAM cells of the CAM array, where n is an integer greater than one, and wherein each data word has an associated pointer stored in the same row as the corresponding data word, the method comprising:

(a) determining that the CAM array stores the data word chain;

(b) comparing the address of the row in the CAM array that stores the nth data word with the pointers of each of the data words;

(c) setting x equal to the pointer of the nth data word;

(d) setting y equal to the address of the row in the CAM array that stores the nth data word;

(e) invalidating the data word at address y;

(f) comparing x with the pointers of the remaining valid data words;

(g) setting y equal to x;

(h) setting x equal to the pointer at the address of x in the CAM array; and (i) repeating (e)–(h), inclusive, until x is equal to a null pointer associated with the first data word of the data word chain.

34. The method of claim 33, further comprising invalidating the first data word of the data word chain.

35. A method of invalidating one or more valid data words of a data word chain stored in a content addressable memory (CAM) array, wherein the data word chain comprises a sequence of n data words each stored in a unique row of CAM cells of the CAM array, where n is an integer greater than one, and wherein each data word has an associated pointer stored in the same row as the corresponding data word, the method comprising:

(a) determining that the CAM array stores the data word chain;

(b) comparing the address of the row in the CAM array that stores the nth data word with the pointers of each of the data words;

(c) setting x equal to the pointer of the nth data word;

(d) setting y equal to the address of the row in the CAM array that stores the nth data word;

(e) marking the data word at address y for invalidation;

(f) comparing x with the pointers of the remaining valid data words;

(g) setting y equal to x;

(h) setting x equal to the pointer at the address of x in the CAM array;

(i) repeating (e)–(h), inclusive, until x is equal to a null pointer associated with the first data word of the data word chain; and (j) invalidating all marked data words.

36. A method of invalidating one or more valid data words of a data word chain stored in a content addressable memory (CAM) array, wherein the data word chain comprises a sequence of n data words each stored in a unique row of CAM cells of the CAM array, where n is an integer greater than one, and wherein each data word has an associated pointer stored in the same row as the corresponding data word, the method comprising:

(a) determining that the CAM array stores the data word chain;

(b) comparing the address of the row in the CAM array that stores the nth data word with the pointers of each of the data words;

(c) setting x equal to the pointer of the nth data word;

(d) setting y equal to the address of the row in the CAM array that stores the nth data word;

(e) marking the data word at address y for invalidation;

(f) comparing x with the pointers of the remaining valid data words;

(g) setting y equal to x;

(h) setting x equal to the pointer at the address of x in the CAM array;

(i) repeating (e)–(h), inclusive, until x the result of (f) indicates more than one match; and (j) invalidating all marked data words.

37. The method of claim 3 wherein the null pointer value comprises a bit to indicate a null state.

38. The method of claim 8 wherein the null pointer comprises a bit to indicate a null state.

39. The method of claim 14 wherein the null pointer comprises a bit to indicate a null state.

40. The method of claim 19 wherein the null pointer comprises a bit to indicate a null state.

41. The method of claim 27 wherein the null pointer comprises a bit to indicate a null state.

42. A method of writing a data word chain into an array of content addressable memory (CAM) cells within a CAM device, the method comprising:

storing a first data word of the data word chain in a data field of a first row of the CAM cells;

storing a null pointer value in a pointer field of the first row of the CAM cells; and storing a second data word of the data word chain in a data field of a second row of the CAM cells.

43. The method of claim 42 further comprising storing an address of the first row of CAM cells in a pointer field of the second row of the CAM cells.

44. The method of claim 42 wherein storing the first data word and storing the null pointer comprise:

appending the null pointer value to the first data word to form a concatenated value; and storing the concatenated value in the first row of the CAM cells.

45. The method of claim 42 wherein the null pointer value comprises an address value that is outside an addressable range of the CAM cells.

46. The method of claim 42 wherein the null pointer value comprises a bit to indicate a null state.

47. The method of claim 42 further comprising determining that a first plurality of rows of the CAM cells do not have valid data stored therein; and selecting the first row of the CAM cells from among the first plurality of rows of the CAM cells.

* * * * *